US011874495B2

(12) United States Patent
Koene et al.

(10) Patent No.: US 11,874,495 B2
(45) Date of Patent: Jan. 16, 2024

(54) MONOLITHIC PHOTONIC INTEGRATED CIRCUIT AND OPTO-ELECTRONIC SYSTEM COMPRISING THE SAME

(71) Applicant: EFFECT PHOTONICS B.V., Eindhoven (NL)

(72) Inventors: Tim Koene, Eindhoven (NL); Niall Patrick Kelly, Eindhoven (NL)

(73) Assignee: EFFECT PHOTONICS B.V., Eindhoven (NL)

( * ) Notice: Subject to any disclaimer, the term of this patent is extended or adjusted under 35 U.S.C. 154(b) by 0 days.

(21) Appl. No.: 17/672,847

(22) Filed: Feb. 16, 2022

(65) Prior Publication Data

US 2022/0276434 A1    Sep. 1, 2022

(30) Foreign Application Priority Data

Feb. 26, 2021    (EP) .................................... 21159616

(51) Int. Cl.
*G02B 6/12*    (2006.01)
*G02B 6/30*    (2006.01)
(Continued)

(52) U.S. Cl.
CPC ............... *G02B 6/12004* (2013.01); *G02B 2006/12121* (2013.01); *H01S 5/026* (2013.01); *H01S 5/101* (2013.01); *H01S 5/4068* (2013.01)

(58) Field of Classification Search
CPC ........... G02B 6/12011; G02B 6/12019; G02B 2006/12121; G02B 2006/12035;
(Continued)

(56) References Cited

U.S. PATENT DOCUMENTS

2003/0223672 A1* 12/2003 Joyner ............... G02B 6/12016
385/14
2004/0042069 A1* 3/2004 Fisher ..................... H01S 5/026
359/344
(Continued)

FOREIGN PATENT DOCUMENTS

CN        203732764 U    7/2014
JP        2004523113 A    7/2004
(Continued)

OTHER PUBLICATIONS

Japanese Office Action dated Nov. 29, 2022 for family member Application No. 2022-027507.
(Continued)

*Primary Examiner* — Ryan A Lepisto
*Assistant Examiner* — Erin D Chiem
(74) *Attorney, Agent, or Firm* — Hudak, Shunk & Farine Co. LPA

(57) ABSTRACT

A monolithic InP-based PIC having a first photonic assembly that has a first optical splitter-combiner unit having a first end part that is optically connected with a first optical waveguide and a second end part that is optically connected with a first main photonic circuit and a first auxiliary photonic circuit. The first auxiliary photonic circuit has a first laser unit, and a first SOA. The first SOA is configurable to be in a first operational state in which the first SOA allows optical communication between the first laser unit and the first optical splitter-combiner unit, or a second operational state in which the first SOA prevents optical communication between the first laser unit and the first optical splitter-combiner unit. An opto-electronic system including the PIC.

19 Claims, 4 Drawing Sheets

(51) Int. Cl.
    *G02B 6/42*       (2006.01)
    *H01S 5/40*       (2006.01)
    *H01S 5/14*       (2006.01)
    *H01S 5/042*     (2006.01)
    *H01S 5/10*       (2021.01)
    *H01S 5/323*     (2006.01)
    *H01S 5/026*     (2006.01)

(58) Field of Classification Search
    CPC ...... H01S 5/0265; H01S 5/026; H01S 5/1007;
              H01S 5/14; H01S 5/04256; H01S 5/101;
                                      H01S 5/4068
    See application file for complete search history.

(56) References Cited

U.S. PATENT DOCUMENTS

2018/0249555 A1*   8/2018   Sugiyama ................ H01S 5/00
2020/0264366 A1    8/2020   Kuindersma et al.

FOREIGN PATENT DOCUMENTS

| | | |
|---|---|---|
| JP | 2007532980 A | 11/2007 |
| JP | 2019160840 A | 3/2018 |
| JP | 2018139266 A | 9/2018 |

OTHER PUBLICATIONS

Taiwanese Office Action dated Mar. 13, 2023 for family member Application No. 11105650.

\* cited by examiner

MONOLITHIC PHOTONIC INTEGRATED CIRCUIT AND OPTO-ELECTRONIC SYSTEM COMPRISING THE SAME

FIELD OF THE INVENTION

The present invention relates to a monolithic indium phosphide (InP)-based photonic integrated circuit (PIC) that can be used for example but not exclusively for telecommunication applications or sensor applications. The invention further relates to an opto-electronic system, which can be used for example but not exclusively for telecommunication applications or sensor applications, wherein the opto-electronic system comprises said monolithic InP-based PIC.

BACKGROUND OF THE INVENTION

PICs, for example but not exclusively in the field of optical telecommunication applications, are becoming increasingly complex because of the increasing number of optical and electrical functions that are integrated on a single die that preferably has a footprint that is as small as possible. The most versatile technology platform for PICs especially for optical telecommunication applications uses wafers comprising InP-based semiconductor materials. InP-based technology enables monolithic integration of both active components such as for example light-generating and/or light-absorbing optical devices, and passive components such as for example light-guiding and/or light-switching optical devices, in one PIC on a single die.

A common problem related to packaging of PICs, is the alignment of an optical fiber or lens with an integrated optical waveguide of the PIC. The optical radiation in the integrated optical waveguide of the PIC is concentrated in a very small area, usually sub-micron scale. In order to reduce coupling loss, the alignment between the optical fiber or lens and the integrated optical waveguide of the PIC needs to be optimized before they are fixed in place relative to each other during packaging.

Commonly, the alignment of an optical fiber with an integrated optical waveguide of the PIC is done in three consecutive stages, i.e. a so-called first light stage, followed by an active alignment stage, and a coupling measurement stage.

In the first light stage, the optical fiber is manipulated to roughly find the correct position relative to the integrated optical waveguide of the PIC. In order to do this, optical radiation or light is generated by the PIC that exits the PIC at the integrated optical waveguide in front of which the optical fiber is positioned. External optical measurement equipment is used to measure the amount of optical power of the light that couples into the optical fiber when being positioned at various locations with respect to the integrated optical waveguide of the PIC. The position of the optical fiber with respect to the integrated optical waveguide of the PIC at which the largest amount of optical power is coupled into the optical fiber is selected as a starting position for the active alignment stage.

In the active alignment stage, an algorithm is used to perform a sweep, e.g. a spiral sweep, of the axes of movement to optimize the amount of optical power that couples into the optical fiber. In this way, an optimized alignment location can be found at which the optical fiber and the integrated optical waveguide of the PIC are optimally aligned with respect to each other.

In the coupling measurement stage, usually a fixed amount of optical power is injected into the optical fiber that is positioned in the optimized alignment location that was determined during the active alignment stage. By measuring the amount of optical power that is coupled into the integrated optical waveguide using an integrated photodetector of the PIC, the amount of coupling loss can be determined for the optimized alignment location. The determined amount of coupling loss at the optimized alignment location can be used for process control.

A disadvantage of the above-mentioned three stages of the commonly used fiber-to-PIC alignment is that performing the three stages is quite cumbersome and as a result limits the throughput of a production station at which the fiber-to-PIC alignment is performed. Therefore, there is a need for providing an improved way of achieving fiber-to-PIC alignment with a desired coupling loss that allows an improved throughput of the production station at which the fiber-to-PIC alignment is performed.

SUMMARY OF THE INVENTION

It is an object of the present invention to provide a monolithic InP-based PIC, which can be used for example but not exclusively for telecommunication applications or sensor applications, pre-empting or at least reducing at least one of the above-mentioned and/or other disadvantages associated with fiber-to-PIC alignment known in the art.

It is also an object of the present invention to provide an opto-electronic system that can be used for example but not exclusively for telecommunication applications or sensor applications comprising a monolithic InP-based PIC according to the invention.

Aspects of the present invention are set out in the accompanying independent and dependent claims. Features from the dependent claims may be combined with features from the independent claim as appropriate and not merely as explicitly set out in the claims. Furthermore, all features may be replaced with other technically equivalent features.

At least one of the abovementioned objects is achieved by a monolithic InP-based PIC comprising a first photonic assembly that comprises:

- a first optical splitter-combiner unit having a first end part that is provided with at least a first optical interface and a second end part that is provided with at least a second optical interface and a third optical interface;
- a first optical waveguide that is arranged in optical communication with the first optical interface of the first optical splitter-combiner unit;
- a first main photonic circuit that is arranged in optical communication with the second optical interface of the first optical splitter-combiner unit; and
- a first auxiliary photonic circuit that is arranged in optical communication with the third optical interface of the first optical splitter-combiner unit, the first auxiliary photonic circuit comprising:
  - a first laser unit; and
  - a first semiconductor optical amplifier, SOA, having a first end facet that is arranged in optical communication with the third optical interface of the first optical splitter-combiner unit, and a second end facet that is arranged in optical communication with the first laser unit, the first SOA being configurable to be in:
    - a first operational state in which optical communication between the first laser unit and the first optical splitter-combiner unit is allowed; or a second operational state in which optical communication between the first laser unit and the first optical splitter-combiner unit is prevented.

The first main photonic circuit of the monolithic InP-based PIC according to the invention can be any optical circuit, such as for example an optical receiver or an optical transmitter that usually comprises a complex main InP-based laser, such as for example a multi-element tunable laser.

The first laser unit of the first auxiliary photonic circuit can be used for on-chip generation of laser light that can be used in the above-mentioned first light stage and subsequent active alignment stage of fiber-to-PIC alignment irrespective of the type of the first main photonic circuit. The first laser unit typically comprises a simple type of laser, such as for example a Fabry-Perot (FP) laser, a ring laser, a distributed feedback (DFB) laser, a single-section or a multi-section distributed Bragg reflector (DBR) laser. The person skilled in the art will appreciate that also a super-luminescent light emitting diode (SLD) or a semiconductor optical amplifier (SOA) can be used in the first laser unit. In that case, the first laser unit comprises at least two optical reflectors. The SLD or the SOA must be arranged in between the at least two optical reflectors in order to provide optical radiation having enough directivity to allow sufficient coupling of the optical radiation into an optical fiber that must be coupled with the PIC. Because of the lack of directivity of optical radiation emitted by light sources relying on spontaneous emission or amplified spontaneous emission, this kind of optical radiation does not allow the degree of coupling into an optical fiber that is required for achieving high-quality fiber-to-PIC alignment. Therefore, a light emitting diode (LED) as such is not a preferred source of optical radiation to be applied in the first auxiliary photonic circuit of the monolithic InP-based PIC according to the present invention.

Especially in the case that the first main photonic circuit is an optical transmitter comprising a complex main laser, it is advantageous when performing fiber-to-PIC alignment at the production station to use the simple laser of the first laser unit of the first auxiliary photonic circuit instead of the complex main laser of the first main photonic circuit. Operating the complex main laser typically requires amongst others turning on a significant number of current sources, and significant control and mode mapping at or prior to the fiber-to-PIC alignment production station. As a result of the latter, operating the complex main laser is rather cumbersome. This can reduce the throughput of the fiber-to-PIC alignment production station. Operating the simple laser of the first laser unit of the first auxiliary photonic circuit for generating the on-chip laser light is less cumbersome, therefore the throughput of the fiber-to-PIC production station can be improved.

Another advantage of using the first laser unit of the first auxiliary photonic circuit is that on-chip laser light for the purpose of fiber-to-PIC alignment is available even if the first main photonic circuit is an optical receiver.

The person skilled in the art will appreciate that for performing fiber-to-PIC alignment, the first SOA of the first auxiliary photonic circuit has to be configured to assume the first operational state in order to allow optical communication between the first laser unit and the first optical splitter-combiner unit. In this way, laser light generated by the first laser unit can be used in the above-mentioned first light stage and the subsequent active alignment stage of the fiber-to-PIC alignment. In addition, when the first SOA is configured to be in the first operational state, it allows short high-power optical pulses generated by the first laser unit to be provided to the optical fiber that is connected to the PIC. These short optical pulses can be used for example in fiber diagnostics, such as optical time-domain reflectometry (OTDR).

In the above-mentioned coupling measurement stage of the fiber-to-PIC alignment, the first SOA of the first auxiliary photonic circuit can be used as a known photodiode in coupling loss measurements. In that case, the first SOA has to be configured to be in the second operational state in which the first SOA can absorb optical radiation incident on its first end facet.

The person skilled in the art will appreciate that when the first SOA is configured to be in the second operational state and the first laser unit is configured to emit laser light, the first SOA can be used to measure the optical power of the laser light emitted by the first laser unit. In this way, the monolithic PIC according to the invention is provided with a self-diagnostic capability.

In normal operation of the first main photonic circuit, irrespective of its actual functionality, it is imperative that there is no optical communication between the first laser unit of the auxiliary photonic circuit and the first optical splitter-combiner unit in order to prevent impairments in external optical systems that are arranged in optical communication with the first main photonic circuit of the monolithic PIC according to the invention. This can be achieved by configuring the first SOA to be in the second operational state in which optical radiation incident on its first end facet is absorbed, thereby preventing optical communication between the first laser unit and the first optical splitter-combiner unit, and/or back reflections of laser light into the optical fiber that interconnects the external optical system and the monolithic PIC according to the invention. The person skilled in the art will appreciate that the first optical-splitter combiner unit can be a multimode interference (MMI)-based optical splitter-combiner unit.

Moreover, the person skilled in the art will appreciate that in normal operation of the first main photonic circuit, irrespective of its actual functionality, the first SOA of the first auxiliary photonic circuit, when being in the second operational state, can be used for in-field power monitoring and/or for providing a power monitor (RSSI or RX strength) control signal. These are additional benefits provided by the first SOA of the first auxiliary photonic circuit of the monolithic PIC according to the present invention.

The person skilled in the art will appreciate that the present invention provides a triple purpose monolithic PIC that can be used for both transmitter (TX) or receiver (RX) channels of a photonic system. The first use is generation of on-chip laser light by the first laser unit. When the first SOA of the first auxiliary photonic circuit is configured to be in the first operational state, the on-chip generated laser light can be used for fiber-to-PIC alignment. In the case that the first laser unit is configured to generate short high-power optical pulses, these short optical pulses can be used for example in fiber diagnostics, such as OTDR. The second use is light detection by the first SOA when it is configured to be in the second operational state. The third use is in-line optical power monitoring of for example a received optical signal in the case that the first main photonic circuit is an optical receiver that is in normal use.

The person skilled in the art will appreciate that the monolithic PIC according to the invention provides a solution to the problem of providing an optical signal, either generated or received, that can be used to achieve improved fiber-to-PIC alignment. Solutions known from the state of the art for improving fiber-to-PIC alignment involve the application of on-chip photodetectors, optical reflectors or loopback waveguides. A disadvantage of on-chip photodetectors is that they cannot generate optical radiation required for the first light finding stage of the fiber-to-PIC alignment. A disadvantage of optical reflectors or loopback waveguides is that they can cause back reflections of light to the external optical system which can be detrimental to the normal use of the external optical system.

The PIC according to the invention renders the use of for example on-chip photodetectors, optical reflectors or loopback waveguides unnecessary, thereby allowing a reduced component count compared to solutions known from the state of the art. Due to the reduced component count, the area of the PIC according to the invention can be reduced compared to solutions known from the state of the art. As a result, the costs of the PIC according to the invention can be reduced.

Based on the above, the person skilled in the art will appreciate that the fiber-to-PIC alignment can be improved by the monolithic InP-based PIC according to the invention. As a result, the throughput of the production station at which the fiber-to-PIC alignment is performed can be improved. Hence, the monolithic InP-based PIC according to the invention pre-empts or at least reduces at least one of the above-mentioned and/or other disadvantages associated with fiber-to-PIC alignment known in the art and allows to reduce costs.

In an embodiment of the monolithic InP-based photonic integrated circuit according to the invention, the first SOA, when being in the first operational state, is configured to amplify optical radiation incident on the second end facet of the first SOA and to emit the amplified optical radiation at the first end facet of the first SOA towards the third optical interface of the first optical splitter-combiner unit, and wherein the first SOA, when being in the second operational state, is configured to absorb optical radiation incident on the first end facet of the first SOA.

The first operational state of the first SOA can be achieved by electrically forward biasing the first SOA. As mentioned above, when being in the first operational state, the first SOA can amplify laser light that is generated by the first laser unit and that is incident on its second end facet. The amplified laser light that is emitted at the first end facet of the first SOA is incident on the third optical interface of the first optical splitter-combiner unit of the PIC. As mentioned above, the amplified light can be used for at least one of fiber-to-PIC alignment and fiber diagnostics, such as OTDR. Amplification by the first SOA of the laser light generated by the first laser unit is advantageous for the above-mentioned first light stage of the fiber-to-PIC alignment as an enhanced optical power of the laser light used can increase the capture range of a first light search. As a result, a good starting position of the optical fiber relative to the integrated optical waveguide of the PIC for the subsequent active alignment stage can be determined faster. This can improve the throughput of the fiber-to-PIC alignment production station.

In the active alignment stage, the use of laser light having an increased optical power is also beneficial. The person skilled in the art will appreciate that in the active alignment stage, laser light with a strong fundamental mode (TE0) is desired as this generates the cleanest gaussian beam profile for the alignment algorithm to work with.

The first SOA can be configured to be in the second operational state by electrically reverse biasing the first SOA. As mentioned above, during normal use of the first main photonic circuit, the first SOA typically remains in the second operational state in order to shield the first auxiliary photonic circuit from the first main photonic circuit by absorbing all incident light incident on at least one of the first end facet and the second end facet of the first SOA. By keeping the first SOA electrically reverse biased, optical communication between the first laser unit and the first main photonic circuit can be prevented during normal use of the first main photonic circuit. In this way, the above-mentioned advantage of at least reducing and ultimately preventing back reflections of optical radiation originating from the first main photonic circuit during normal use of the first main photonic circuit can be achieved. As a result, impairments in telecommunication networks that are optically interconnected with the first main photonic circuit can be reduced and ultimately be prevented.

Electrically reverse biasing the first SOA during normal use of the first main photonic circuit can also provide at least one of the above-mentioned advantages regarding in-field power monitoring and providing a power monitor (RSSI or RX strength) control signal. In addition, the reverse biased first SOA can be used to measure the optical power of the laser light emitted by the first laser unit. As mentioned above, in this way the monolithic PIC according to the invention is provided with a self-diagnostic capability.

In an embodiment of the monolithic InP-based photonic integrated circuit according to the invention, the first laser unit and the first SOA are provided with a common p-type ohmic contact.

In this way, the first laser unit and the first SOA can be provided with a single contact for use in both light generation and power monitoring. The single contact also allows simultaneous electrically forward or reverse biasing of the first laser unit and the first SOA. Furthermore, an advantage of providing the first laser unit and the first SOA with a common p-type ohmic contact is that wire bonding complexity can be reduced.

In an embodiment of the monolithic InP-based photonic integrated circuit according to the invention, the first main photonic circuit is configured and arranged to be an optical receiver.

In this case, the first main photonic circuit can be configured and arranged to receive optical radiation emitted by an InP-based laser unit of an optical module that is arranged in optical communication with the first main photonic circuit. The person skilled in the art will appreciate that the optical module can be an external optical module that is arranged in optical communication with the first main photonic circuit of the PIC via an optical fiber.

The first main photonic circuit can also be configured to receive optical radiation that is emitted by the first laser unit of the first auxiliary photonic circuit. In this case, the PIC according to the invention can be provided with self-testing capability regarding the operation of the first main photonic circuit.

During normal operation of the first main photonic circuit, i.e. when the first main photonic circuit receives optical radiation from the InP-based laser unit of the intended optical module with which it is arranged in optical communication, unwanted back reflections towards the first main photonic circuit that could be caused by the first auxiliary photonic circuit can at least be reduced and ultimately be prevented by keeping the first SOA of the first auxiliary photonic circuit reversed biased. As mentioned above, by reverse biasing the first SOA, optical radiation emitted by the InP-based laser unit of the intended optical module that is incident on the first end facet of the SOA can be absorbed, thereby shielding the first auxiliary photonic circuit from the first main photonic circuit.

In an embodiment of the monolithic InP-based photonic integrated circuit according to the invention, the first laser unit comprises:
- a second SOA having a third end facet and a fourth end facet;
- a first optical reflector that is arranged in optical communication with:
  - the second end facet of the first SOA; and
  - the third end facet of the second SOA;
  and
- a second optical reflector that is arranged in optical communication with the fourth end facet of the second SOA.

The combination of the second SOA that is arranged in optical communication with both the first optical reflector and the second optical reflector can be construed as a facet laser that can be configured to emit optical radiation as a result of stimulated emission of photons. The person skilled in the art will appreciate that the second SOA is used as the gain medium of the facet laser. The second SOA can be replaced by the above-mentioned SLD.

In an exemplary embodiment of the PIC according to the invention, the first SOA and the second SOA have an identical optical cavity length in order to reduce the chip area required.

In an embodiment of the monolithic InP-based photonic integrated circuit according to the invention, the first auxiliary photonic circuit further comprises:
- a second optical waveguide that is arranged to optically interconnect the third optical interface of the first optical splitter-combiner unit and the first end facet of the first SOA;
- a third optical waveguide that is arranged to optically interconnect the second end facet of the first SOA and the first optical reflector; and
- a fourth optical waveguide that is arranged to optically interconnect the first optical reflector and the third end facet of the second SOA.

This embodiment of the monolithic InP-based PIC according to the invention that comprises two SOAs and four optical waveguides allows the above-mentioned advantages to be reduced to practice.

In an embodiment of the monolithic InP-based photonic integrated circuit according to the invention, at least one of the first SOA and the second SOA is configured and arranged to be driven with a direct current source.

Applying a direct current (DC) for driving the second SOA of the first laser unit, enables the first laser unit to generate continuous optical radiation with a high optical output power. With the first SOA in the first operational state, i.e. allowing optical communication between the second SOA and the first optical splitter-combiner unit of the first main photonic circuit, the high-power continuous optical radiation that is provided by the first auxiliary photonic circuit to the first main photonic circuit is beneficial in the first light detection stage of the fiber-to-PIC alignment process.

In the case that both the first SOA and the second SOA are driven with a DC current, the optical output power of the continuous optical radiation generated by the second SOA can further be increased by the first SOA. As a result, the first auxiliary photonic circuit can provide continuous optical radiation with an even higher optical output power to the first main photonic circuit. This is even more beneficial for the first light detection stage of the fiber-to-PIC alignment process.

It is also possible to drive the first SOA and the second SOA separately with a DC current source. It is for example possible to reverse bias the first SOA while driving the second SOA with the DC current source. In this case, a self-diagnostic of the first auxiliary photonic circuit can be performed as the continuous optical radiation emitted by the forward biased second SOA can be monitored by the reverse biased first SOA. In addition, it can be determined whether the first SOA absorbs all of the optical radiation emitted by the second SOA by checking if no continuous optical radiation emitted by the second SOA is detected at the first optical splitter-combiner unit of the first main photonic circuit.

In an embodiment of the monolithic InP-based photonic integrated circuit according to the invention, the first SOA and the second SOA are configured and arranged to be driven with a pulsed current source or the second SOA is configured and arranged to be driven with a pulsed current source.

Applying a pulsed current to the second SOA of the first laser unit, enables the first laser unit to generate pulsed optical radiation with a high optical output power. With the first SOA in the first operational state, i.e. allowing optical communication between the second SOA and the first optical splitter-combiner unit of the first main photonic circuit, the high-power pulsed optical radiation that in this case is provided by the first auxiliary photonic circuit to the first main photonic circuit is beneficial in the first light detection stage of the fiber-to-PIC alignment process. In addition, short high-power optical pulses generated by the second SOA can be used for example in fiber diagnostics, such as OTDR.

In the case that both the first SOA and the second SOA are driven with a pulsed current, the optical output power of the pulsed optical radiation generated by the second SOA can further be increased by the first SOA. As a result, the first auxiliary photonic circuit can provide pulsed optical radiation with an even higher optical output power to the first main photonic circuit. This is even more beneficial for the first light detection stage of the fiber-to-PIC alignment process and fiber diagnostics such as OTDR.

In an embodiment of the monolithic InP-based photonic integrated circuit according to the invention, the first laser unit comprises a laser having an optical output facet that is arranged in optical communication with the second end facet of the first SOA.

The person skilled in the art will appreciate that the laser typically is a simple type of laser, such as for example a Fabry-Perot (FP) laser, a ring laser, a distributed feedback (DFB) laser, a single-section or a multi-section distributed Bragg reflector (DBR) laser. By applying the laser instead of the second SOA in the first laser unit, the first optical reflector and the second optical reflector can be omitted. In this way, the component count of the PIC according to the invention can further be reduced.

In an embodiment of the monolithic InP-based photonic integrated circuit according to the invention, the first auxiliary photonic circuit comprises:
- a second optical waveguide that is arranged to optically interconnect the third optical interface of the first optical splitter-combiner unit and the first end facet of the first SOA;
- a third optical waveguide that is arranged to optically interconnect the second end facet of the first SOA and the optical output facet of the laser.

This embodiment of the monolithic InP-based PIC according to the invention that comprises a SOA, a laser and three optical waveguides allows the above-mentioned advantages to be reduced to practice with the additional benefit of a reduced component count compared to the above-mentioned embodiment of the PIC that comprises two SOAs and four optical waveguides.

In an embodiment of the monolithic InP-based photonic integrated circuit according to the invention, at least one of the first SOA and the laser is configured and arranged to be driven with a direct current source.

Applying a DC current to the laser, enables the laser to generate continuous optical radiation with a high optical output power. With the first SOA in the first operational state, i.e. allowing optical communication between the laser and the first optical splitter-combiner unit of the first main photonic circuit, the high-power continuous optical radiation that is provided by the first auxiliary photonic circuit to the first main photonic circuit is beneficial in the first light detection stage of the fiber-to-PIC alignment process.

In the case that both the laser and the first SOA are driven with a DC current, the optical output power of the continuous optical radiation generated by the laser can further be increased by the first SOA. As a result, the first auxiliary photonic circuit can provide continuous optical radiation with an even higher optical output power to the first main photonic circuit. This is even more beneficial for the first light detection stage of the fiber-to-PIC alignment process.

It is also possible to drive the first SOA and the laser separately with a DC current source. It is for example possible to reverse bias the first SOA while driving the laser with the DC current source. In this case, a self-diagnostic of the first auxiliary photonic circuit can be performed as the continuous optical radiation emitted by the forward biased laser can be monitored by the reverse biased first SOA. In addition, it can be determined whether the first SOA absorbs all of the optical radiation emitted by the laser by checking if no continuous optical radiation emitted by the laser is detected at the first optical splitter-combiner unit of the first main photonic circuit.

In an embodiment of the monolithic InP-based photonic integrated circuit according to the invention, the first SOA and the laser are configured and arranged to be driven with a pulsed current source or the laser is configured and arranged to be driven with a pulsed current source.

Applying a pulsed current to the laser, enables the laser to generate pulsed optical radiation with a high optical output power. With the first SOA in the first operational state, i.e. allowing optical communication between the laser and the first optical splitter-combiner unit of the first main photonic circuit, the high-power pulsed optical radiation that in this case is provided by the first auxiliary photonic circuit to the first main photonic circuit is beneficial in the first light detection stage of the fiber-to-PIC alignment process. In addition, short high-power optical pulses generated by the laser can be used for example in fiber diagnostics, such as OTDR.

In the case that both the first SOA and the laser are driven with a pulsed current, the optical output power of the pulsed optical radiation generated by the laser can further be increased by the first SOA. As a result, the first auxiliary photonic circuit can provide pulsed optical radiation with an even higher optical output power to the first main photonic circuit. This is even more beneficial for the first light detection stage of the fiber-to-PIC alignment process and fiber diagnostics, such as OTDR.

In an exemplary embodiment of the monolithic photonic integrated circuit according to the invention, the laser has an optical cavity length that is in a range between 0.05 mm and 1 mm. The skilled person will appreciate that a laser having an optical cavity length in the above-mentioned range is construed as a short-cavity laser. An advantage of applying a short-cavity laser as a light source in the first auxiliary circuit is that the amount of area taken up by the first auxiliary circuit can be reduced. Consequently, the area of the monolithic PIC as a whole can be reduced. This has a positive effect on the costs of the monolithic PIC.

In an exemplary embodiment of the PIC according to the invention, the first SOA and the laser have an identical optical cavity length in order to further reduce the chip area required.

In an embodiment of the monolithic InP-based photonic integrated circuit according to the invention, the monolithic photonic circuit further comprises a second photonic assembly that comprises:

a second optical splitter-combiner unit having a third end part that is provided with at least a fourth optical interface and a fourth end part that is provided with at least a fifth optical interface and a sixth optical interface;

a fifth optical waveguide that is arranged in optical communication with the fourth optical interface of the second optical splitter-combiner unit;

a second main photonic circuit that is arranged in optical communication with the fifth optical interface of the second optical splitter-combiner unit; and a second auxiliary photonic circuit that is arranged in optical communication with the sixth optical interface of the second optical splitter-combiner unit, the second auxiliary photonic circuit comprising:

a second laser unit; and a third SOA having a fifth end facet that is arranged in optical communication with the sixth optical interface of the second optical splitter-combiner unit, and a sixth end facet that is arranged in optical communication with the second laser unit, the third SOA being configurable to be in:

a first operational state in which optical communication between the second laser unit and the second optical splitter-combiner unit is allowed; or a second operational state in which optical communication between the second laser unit and the second optical splitter-combiner unit is prevented;

wherein the first photonic assembly and the second photonic assembly are configured to allow optical radiation that is guided by the first optical waveguide of the first photonic assembly and optical radiation that is guided by the fifth optical waveguide of the second photonic assembly to have different optical polarization states.

Using different polarization states allows the final product to have an increased bandwidth. The skilled person will appreciate that either one of linear, circular and elliptical polarization states can be used.

In an embodiment of the monolithic InP-based photonic integrated circuit according to the invention, at least one of the first photonic assembly and the second photonic assembly is provided with at least one of an optical polarization unit and an optical phase shifter.

The person skilled in the art will appreciate that the optical polarization unit can be used for selecting different linear polarization states. Depending on the specific phase relationship, the optical phase shifter can be used to transform linear, circular and elliptical polarization states from one to another.

According to another aspect of the present invention, an opto-electronic system is provided comprising a monolithic InP-based photonic integrated circuit according to the invention. The opto-electronic system can for example but not exclusively be used for telecommunication applications. In that case, the opto-electronic systems can be one of a transmitter, a receiver, a transceiver, a coherent transmitter, a coherent receiver and a coherent transceiver. Based on the above, it will be clear that the costs for the opto-electronic system according to the invention can be reduced because of the improved way in which an optical fiber can be aligned with respect to the PIC according to the invention. As a result of the improved fiber-to-PIC alignment, the throughput of the production station at which the fiber-to-PIC alignment is performed can be improved. The improved throughput is beneficial for reducing the costs of the PIC and therefore of the opto-electronic system according to the invention.

BRIEF DESCRIPTION OF THE DRAWINGS

Further features and advantages of the invention will become apparent from the description of exemplary and non-limiting embodiments of a monolithic InP-based PIC according to the present invention and of an opto-electronic system comprising such a PIC.

The person skilled in the art will appreciate that the described embodiments of the monolithic InP-based PIC and the opto-electronic system are exemplary in nature only and not to be construed as limiting the scope of protection in any way. The person skilled in the art will realize that alternatives and equivalent embodiments of the monolithic InP-based PIC and the opto-electronic system can be conceived and reduced to practice without departing from the scope of protection of the present invention.

Reference will be made to the figures on the accompanying drawing sheets. The figures are schematic in nature and therefore not necessarily drawn to scale. Furthermore, equal reference numerals denote equal or similar parts. On the attached drawing sheets.

DETAILED DESCRIPTION OF EMBODIMENTS

Figure 1:
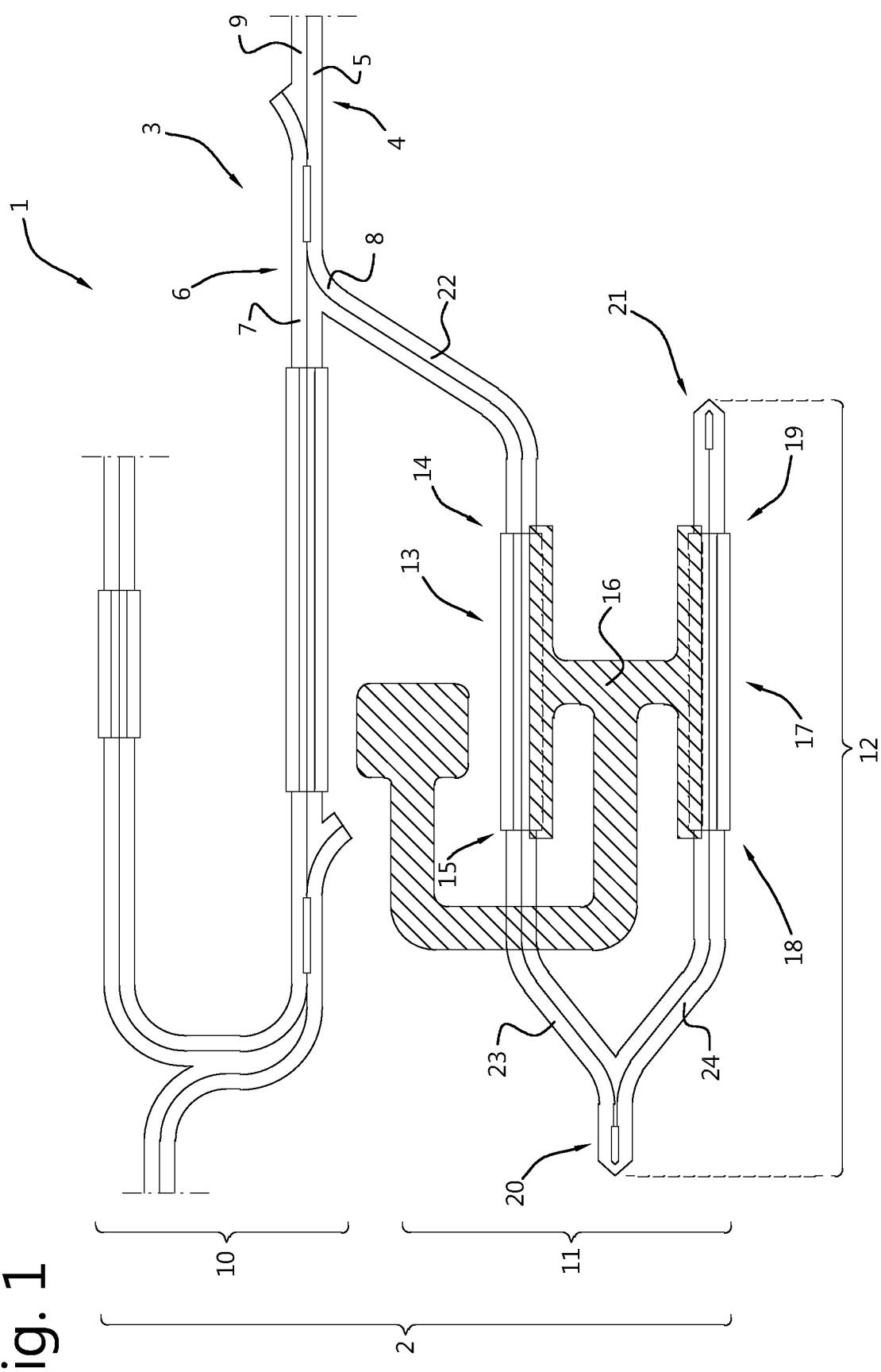
FIG. 1 shows a schematic top view of a part of a first exemplary, non-limiting embodiment of a monolithic InP-based PIC according to the present invention comprising a first auxiliary photonic circuit that comprises two SOAs.

FIG. 1 shows a schematic top view of a part of a first exemplary, non-limiting embodiment of a monolithic InP-based PIC 1 according to the present invention. The PIC 1 comprises a first photonic assembly 2 that comprises a first optical splitter-combiner unit 3 that has a first end part 4 that is provided with a first optical interface 5 and a second end part 6 that is provided with a second optical interface 7 and a third optical interface 8. A first optical waveguide 9 is arranged in optical communication with the first optical interface 5 of the first optical splitter-combiner unit 3. The first optical waveguide 9 is configured and arranged to guide optical radiation to and from the first photonic assembly 2 of the PIC 1. To establish an optical connection between an external opto-electronic system and the monolithic InP-based PIC 1, an external optical fiber can be aligned with respect to the first optical waveguide 9 at an edge (not shown) of the PIC 1.

The first photonic assembly 2 further comprises a first main photonic circuit 10 that is arranged in optical communication with the second optical interface 7 of the first optical splitter-combiner unit 3, and a first auxiliary photonic circuit 11 that is arranged in optical communication with the third optical interface 8 of the first optical splitter-combiner unit 3. The first main photonic circuit 10 can be any optical circuit, such as for example an optical receiver or an optical transmitter that usually comprises a complex main InP-based laser, such as for example a multi-element tunable laser.

The first auxiliary photonic circuit 11 comprises a first laser unit 12 and a first SOA 13 that has a first end facet 14 that is arranged in optical communication with the third optical interface 8 of the first optical splitter-combiner unit 3, and a second end facet 15 that is arranged in optical communication with the first laser unit 12. The first SOA 13 can be configured to be either in a first operational state in which optical communication between the first laser unit 12 and the first optical splitter-combiner unit 3 is allowed or in a second operational state in which optical communication between the first laser unit 12 and the first optical splitter-combiner unit 3 is prevented.

The first laser unit 12 comprises a second SOA 17 that has a third end facet 18 and a fourth end facet 19. The first laser unit 12 further comprises a first optical reflector 20 that is arranged in optical communication with the second end facet 15 of the first SOA 13, and with the third end facet 18 of the second SOA 17. Furthermore, the first laser unit 12 comprises a second optical reflector 21 that is arranged in optical communication with the fourth end facet 19 of the second SOA 17. The combination of the second SOA 17 that is arranged in between the first optical reflector 20 and the second optical reflector 21 can be construed as a facet laser that can be configured to emit optical radiation as a result of stimulated emission of photons. The person skilled in the art will appreciate that the second SOA 17 is used as the gain medium of the facet laser. The second SOA 17 can be replaced by another type of integrated light emitting device provided that the emitted optical radiation has enough directivity to allow sufficient coupling to an optical fiber. An example of such an integrated light emitting device is a super-luminescent light emitting diode (SLD).

In accordance with the exemplary embodiment of the PIC 1 shown in FIG. 1, the first SOA 13 and the second SOA 17 have an identical optical cavity length in order to reduce the chip area required. It will be clear that depending on the requirements of the PIC 1, the first SOA 13 and the second SOA 17 can have non-identical optical cavity lengths.

The first auxiliary photonic circuit 11 further comprises a second optical waveguide 22 that is arranged to optically interconnect the third optical interface 8 of the first optical splitter-combiner unit 3 and the first end facet 14 of the first SOA 13, a third optical waveguide 23 that is arranged to optically interconnect the second end facet 15 of the first SOA 13 and the first optical reflector 20, and a fourth optical waveguide 24 that is arranged to optically interconnect the first optical reflector 20 and the third end facet 18 of the second SOA 17.

The first laser unit 12 of the first auxiliary photonic circuit 11 can be used for on-chip generation of laser light that can be used in the first light stage and subsequent active alignment stage of fiber-to-PIC alignment irrespective of the type of the first main photonic circuit 10. Especially in the case that the first main photonic circuit 10 is an optical transmitter comprising a complex main laser, it is advantageous when performing fiber-to-PIC alignment at a production station to use the simple second SOA 17 of the first laser unit 12 for generating instead of the complex main laser of the first main photonic circuit 10. Operating the complex main laser typically requires amongst others turning on a significant number of current sources, and significant control and mode mapping at or prior to the fiber-to-PIC alignment production station. As a result of the latter, operating the complex main laser is rather cumbersome. This can reduce the throughput of the fiber-to-PIC alignment production station. Operating the simple second SOA 17 for generating the on-chip laser light is less cumbersome, therefore the throughput of the fiber-to-PIC production station can be improved.

Another advantage of using the first laser unit 12 of the first auxiliary photonic circuit 11 is that on-chip laser light for the purpose of fiber-to-PIC alignment is available even if the first main photonic circuit 10 is an optical receiver.

The person skilled in the art will appreciate that for performing fiber-to-PIC alignment, the first SOA 13 has to be configured to assume the first operational state in order to allow optical communication between the first laser unit 12 and the first optical splitter-combiner unit 3. In this way, laser light generated by the second SOA 17 can be used in the above-mentioned first light stage and the subsequent active alignment stage of the fiber-to-PIC alignment. In addition, when the first SOA 13 is configured to be in the first operational state, it allows short high-power optical pulses generated by the second SOA 17 to be provided to the optical fiber (not shown) that is connected to the PIC 1. These short optical pulses can be used for example in fiber diagnostics, such as optical time-domain reflectometry (OTDR).

In the above-mentioned coupling measurement stage of the fiber-to-PIC alignment, the first SOA 13 can be used as a known photodiode in coupling loss measurements. In that case, the first SOA 13 has to be configured to be in the second operational state in which the first SOA 13 can absorb optical radiation incident on its first end facet 14. In order to achieve accurate coupling loss measurements, the person skilled in the art will appreciate that the second SOA 17 has to be configured such that laser light emission is prevented.

The person skilled in the art will appreciate that when the first SOA 13 is configured to be in the second operational state and the second SOA 17 is configured to emit laser light, the first SOA 13 can be used to measure the optical power of the laser light emitted by the second SOA 17. In this way, the monolithic PIC 1 according to the invention is provided with a self-diagnostic capability.

In normal operation of the first main photonic circuit 10, irrespective of its actual functionality, it is imperative that there is no optical communication between the first laser unit 12 and the first optical splitter-combiner unit 3 in order to prevent impairments in external optical systems (not shown) that are arranged in optical communication with the first main photonic circuit 10 of the monolithic PIC 1. Especially, the first optical reflector 20 of the first laser unit 12 should not cause back reflections of laser light into the optical fiber (not shown) that interconnects the external optical system and the monolithic PIC 1. This can be achieved by configuring the first SOA 13 to be in the second operational state in which optical radiation incident on its first end facet 14 is absorbed.

The person skilled in the art will appreciate that in normal operation of the first main photonic circuit 10, irrespective of its actual functionality, the first SOA 13, when being in the second operational state, can be used for in-field power monitoring and/or for providing a power monitor (RSSI or RX strength) control signal.

The first operational state of the first SOA 13 can be achieved by electrically forward biasing the first SOA 13. As mentioned above, when being in the first operational state, the first SOA 13 can amplify laser light that is generated by the second SOA 17 and that is incident on the second end facet 15 of the first SOA 13. The amplified laser light that is emitted at the first end facet 14 of the first SOA 13 is incident on the third optical interface 8 of the first optical splitter-combiner unit 3 of the PIC 1. As mentioned above, the amplified light can be used for at least one of fiber-to-PIC alignment and fiber diagnostics, such as OTDR. Amplification by the first SOA 13 of the laser light generated by the second SOA 17 is advantageous for the above-mentioned first light stage of the fiber-to-PIC alignment as an enhanced optical power of the laser light used can increase the capture range of a first light search. As a result, a good starting position of the optical fiber relative to the integrated optical waveguide of the PIC 1 for the subsequent active alignment stage can be determined faster. This can improve the throughput of the fiber-to-PIC alignment production station.

In the active alignment stage, the use of laser light having an increased optical power is also beneficial. The person skilled in the art will appreciate that in the active alignment stage, laser light with a strong fundamental mode (TE0) is desired as this generates the cleanest gaussian beam profile for the alignment algorithm to work with.

The first SOA 13 can be configured to be in the second operational state by electrically reverse biasing the first SOA 13. As mentioned above, during normal use of the first main photonic circuit 10, the first SOA 13 typically remains in the second operational state in order to shield the first auxiliary photonic circuit 11 from the first main photonic circuit 10 by absorbing all incident light incident on at least one of the first end facet 14 and the second end facet 15 of the first SOA 13. By keeping the first SOA 13 electrically reverse biased, optical communication between the first laser unit 12 and the first main photonic circuit 10 can be prevented during normal use of the first main photonic circuit 10.

The first SOA 13 and the second SOA 17 of the PIC 1 shown in FIG. 1 are provided with a common p-type ohmic contact 16. In this way, the first SOA 13 and the second SOA 17 are provided with a single contact for use in both light generation and power monitoring. The single contact allows simultaneous electrically forward or reverse biasing of the first SOA 13 and the second SOA 17. Another advantage of providing the first SOA 13 and the second SOA 17 with a common p-type ohmic contact 16 is that wire bonding complexity can be reduced.

Based on the above, the person skilled in the art will appreciate that the fiber-to-PIC alignment can be improved by the exemplary embodiment of the monolithic InP-based PIC 1 shown in FIG. 1. As a result, the throughput of the production station at which the fiber-to-PIC alignment is performed can be improved. Hence, the monolithic InP-based PIC 1 according to the invention pre-empts or at least reduces at least one of the above-mentioned and/or other disadvantages associated with fiber-to-PIC alignment known in the art. Furthermore, it allows to reduce costs.

Figure 2:
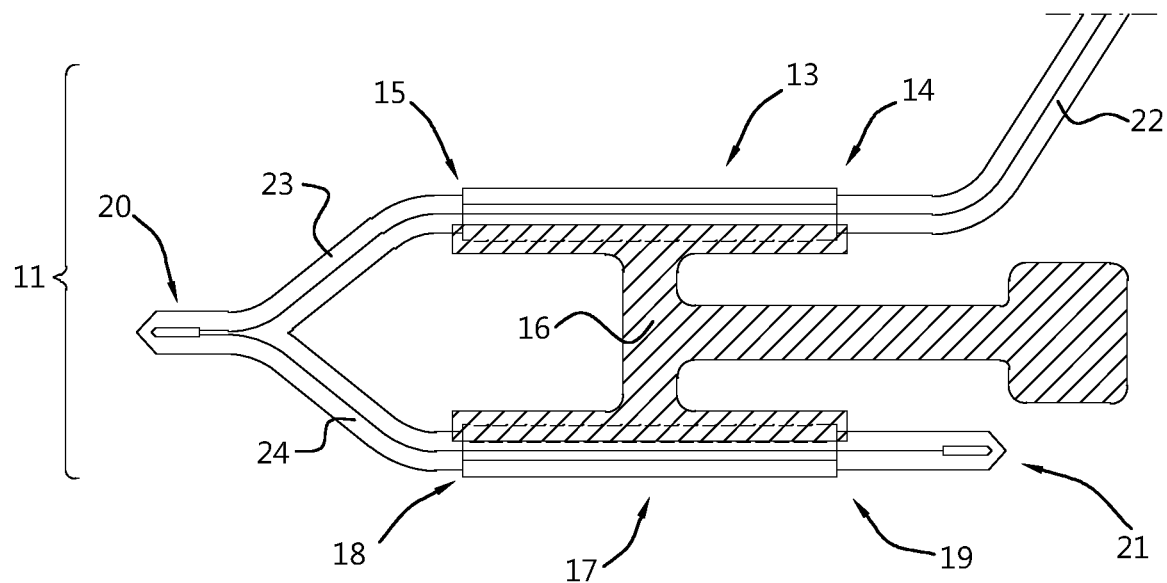
FIG. 2 shows a schematic top view of a part of a second exemplary, non-limiting embodiment of a monolithic InP-based PIC according to the present invention comprising a first auxiliary photonic circuit that is provided with a common p-type ohmic contact that is arranged in accordance with an alternative configuration.

FIG. 2 shows a schematic top view of a part of a second exemplary, non-limiting embodiment of a monolithic InP-based PIC 1 according to the present invention comprising a first auxiliary photonic circuit 11 that is provided with a common p-type ohmic contact 16 that is arranged in accordance with an alternative configuration compared to the configuration of the common p-type ohmic contact 16 shown in FIG. 1. In accordance with the configuration of the common p-type ohmic contact shown in FIG. 1, the metal track of the common p-type ohmic contact crosses over the third optical waveguide 23 of the first auxiliary photonic circuit 11. In accordance with the configuration shown in FIG. 2, that metal track does not need to cross over an optical waveguide.

Figure 3:
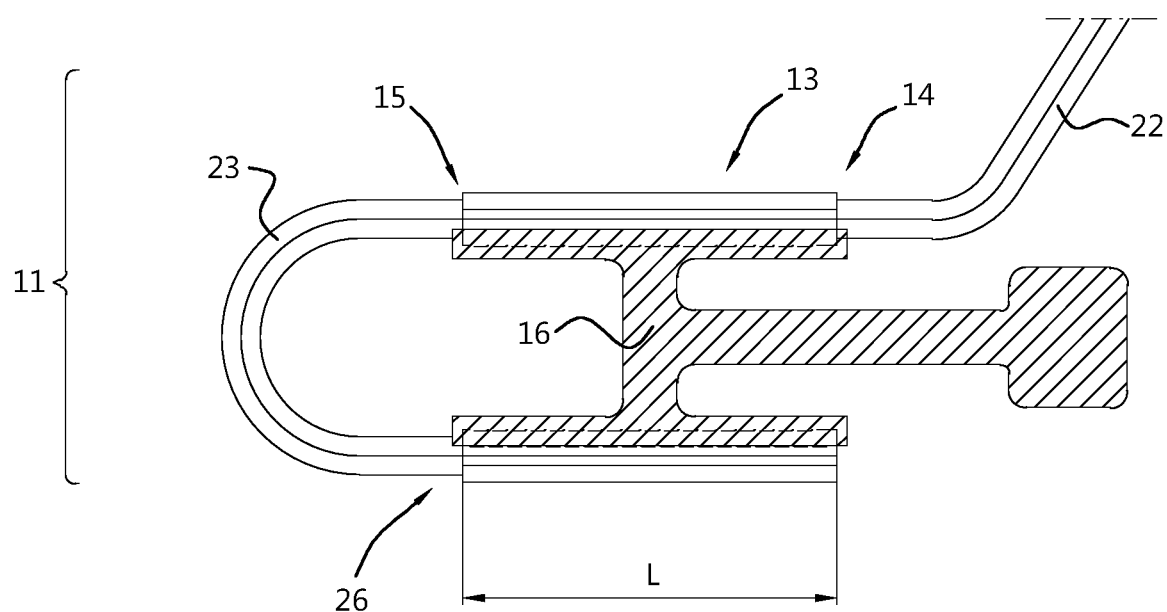
FIG. 3 shows a schematic top view of a part of a third exemplary, non-limiting embodiment of a monolithic InP-based PIC according to the present invention comprising a first auxiliary photonic circuit that comprises a SOA and a laser.

FIG. 3 shows a schematic top view of a part of a third exemplary, non-limiting embodiment of a monolithic InP-based PIC 1 according to the present invention comprising a first auxiliary photonic circuit 11 that comprises the first SOA 13 and wherein the first laser unit 12 is implemented by a laser 25. The laser 25 has an optical output facet 26 that is arranged in optical communication with the second end facet 15 of the first SOA 13. By applying the laser 25 instead of the second SOA 17 as shown in FIG. 1 and FIG. 2, the first optical reflector 20 and the second optical reflector 21 as shown in FIG. 1 and FIG. 2 can be omitted. In this way, the component count of the PIC 1 in accordance with the embodiment shown in FIG. 3 can further be reduced when compared to the embodiments of the PIC 1 shown in FIG. 1 and FIG. 2.

The first auxiliary photonic circuit 11 of the PIC 1 shown in FIG. 3 comprises a second optical waveguide 22 that is arranged to optically interconnect the third optical interface 8 of the first optical splitter-combiner unit 3 (not shown) and the first end facet 14 of the first SOA 13. The first auxiliary photonic circuit 11 further comprises a third optical waveguide 23 that is arranged to optically interconnect the second end facet 15 of the first SOA 13 and the optical output facet 26 of the laser 25.

The laser 25 shown in FIG. 3 can have an optical cavity length L that is in a range between 0.05 mm and 1 mm. The skilled person will appreciate that a laser having an optical cavity length in the above-mentioned range is construed as a short-cavity laser. An advantage of applying a short-cavity laser 25 as a light source in the first auxiliary circuit 11 is that the amount of area taken up by the first auxiliary circuit 11 can be reduced. Consequently, the area of the monolithic PIC 1 as a whole can be reduced. This has a positive effect on the costs of the monolithic PIC 1.

In the exemplary embodiment of the PIC 1 shown in FIG. 3, the first SOA 13 and the laser 25 have an identical optical cavity length in order to further reduce the chip area required. It will be clear that depending on the requirements of the PIC 1, the first SOA 13 and the laser 25 can have non-identical optical cavity lengths.

Figure 4:
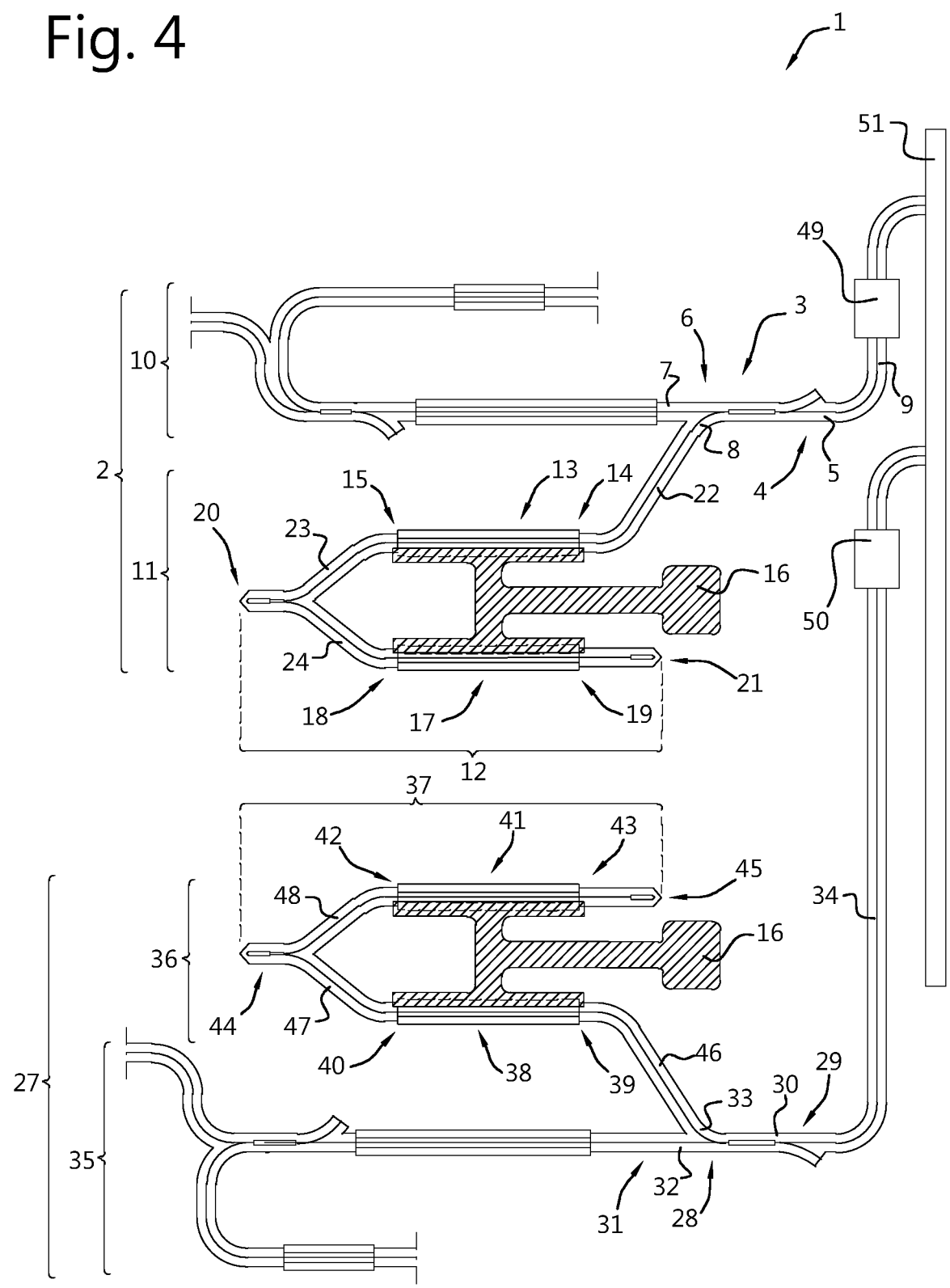
FIG. 4 shows a schematic top view of a part of a fourth exemplary, non-limiting embodiment of a monolithic InP-based PIC according to the present invention comprising a first photonic assembly and a second photonic assembly that are configured to allow optical radiation that is guided by an optical waveguide of the first photonic assembly and optical radiation that is guided by another optical waveguide of the second photonic assembly to have different optical polarization states.

FIG. 4 shows a schematic top view of a part of a fourth exemplary, non-limiting embodiment of a monolithic InP-based PIC 1 according to the present invention comprising a first photonic assembly 2 and a second photonic assembly 27. The details of the first photonic assembly 2 have been discussed in relation to FIG. 1 and therefore will not be repeated here.

The second photonic assembly 27 of the PIC 1 shown in FIG. 4 comprises a second optical splitter-combiner unit 28 having a third end part 29 that is provided with at least a fourth optical interface 30 and a fourth end part 31 that is provided with at least a fifth optical interface 32 and a sixth optical interface 33. A fifth optical waveguide 34 is arranged in optical communication with the fourth optical interface 30 of the second optical splitter-combiner unit 28. The fifth optical waveguide 34 is configured and arranged to guide optical radiation to and from the second photonic assembly 27 of the PIC 1. The fifth optical waveguide 34 of the second photonic assembly 27 and the first optical waveguide 9 of the first photonic assembly 2 can be combined into a common optical waveguide (not shown). To establish an optical connection between an external opto-electronic system and the monolithic InP-based PIC 1, an external optical fiber can be aligned with respect to the common optical waveguide at an edge 51 of the PIC 1.

The second photonic assembly 27 further comprises a second main photonic circuit 35 that is arranged in optical communication with the fifth optical interface 32 of the second optical splitter-combiner unit 28, and a second auxiliary photonic circuit 36 that is arranged in optical communication with the sixth optical interface 33 of the second optical splitter-combiner unit 28. The second main photonic circuit 35 can be any optical circuit, such as for example an optical receiver or an optical transmitter that usually comprises a complex main InP-based laser, such as for example a multi-element tunable laser.

The second auxiliary photonic circuit 36 comprises a second laser unit 37 and a third SOA 38 that has a fifth end facet 39 that is arranged in optical communication with the sixth optical interface 33 of the second optical splitter-combiner unit 28, and a sixth end facet 40 that is arranged in optical communication with the second laser unit 37. The third SOA 38 can be configured to be either in a first operational state in which optical communication between the second laser unit 37 and the second optical splitter-combiner unit 28 is allowed or in a second operational state in which optical communication between the second laser unit 37 and the second optical splitter-combiner unit 28 is prevented.

The second laser unit 37 comprises a fourth SOA 41 that has a seventh end facet 42 and an eighth end facet 43. The second laser unit 37 further comprises a third optical reflector 44 that is arranged in optical communication with the sixth end facet 40 of the third SOA 38, and with the seventh end facet 42 of the fourth SOA 41. Furthermore, the second laser unit 37 comprises a fourth optical reflector 45 that is arranged in optical communication with the eighth end facet 43 of the fourth SOA 41. Similarly, as explained with reference to the first laser unit 12 of the first photonic assembly 2 shown in FIG. 1, the combination of the fourth SOA 41 that is arranged in between the third optical reflector 44 and the fourth optical reflector 45 can be construed as a facet laser that can be configured to emit optical radiation as a result of stimulated emission of photons.

Moreover, it will be clear the combination of the fourth SOA 41 that is arranged in between the third optical reflector 44 and the fourth optical reflector 45 can be replaced by a laser in order to reduce the component count of the PIC 1.

The person skilled in the art will appreciate that the second photonic assembly 27 can be operated in a same way as described above in relation to the first photonic assembly 2. Furthermore, all considerations mentioned above regarding individual components or combinations of components of the first photonic assembly 2 of the PIC 1 shown in FIG. 1 apply mutatis mutandis to the individual components or combination of components of the first photonic assembly 2 and the second photonic assembly 27 of the PIC 1 shown in FIG. 4.

The first photonic assembly 2 and the second photonic assembly 27 of the PIC 1 shown in FIG. 4 are configured to allow optical radiation that is guided by the first optical waveguide 9 of the first photonic assembly 2 and optical radiation that is guided by the fifth optical waveguide 34 of the second photonic assembly 27 to have different optical polarization states. Using different polarization states allows the final product to have an increased bandwidth. The skilled person will appreciate that either one of linear, circular and elliptical polarization states can be used.

In accordance with the embodiment of the monolithic InP-based PIC 1 shown in FIG. 4, the first optical waveguide 9 of the first photonic assembly 2 is provided with an optical polarization unit 49 and the fifth optical waveguide 34 of the second photonic assembly 27 is provided with an optical phase shifter 50. The person skilled in the art will appreciate that the optical polarization unit 49 can be used for selecting different linear polarization states. Depending on the specific phase relationship, the optical phase shifter 50 can be used to transform linear, circular and elliptical polarization states from one to another.

Figure 5:
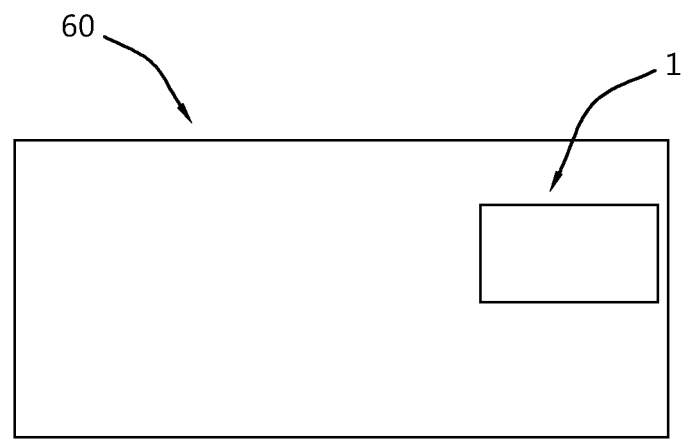
FIG. 5 shows a schematic view of a first exemplary, non-limiting embodiment of an opto-electronic system that can be used for example but not exclusively for telecommunication applications or sensor applications, the opto-electronic system comprising a monolithic InP-based PIC according to the present invention.

FIG. 5 shows a schematic view of a first exemplary, non-limiting embodiment of an opto-electronic system 50 that can be used for example but not exclusively for telecommunication applications or sensor applications, the opto-electronic system 50 comprising a monolithic InP-based PIC 1 according to the present invention. The opto-electronic system 50 can for example be one of a transmitter, a receiver, a transceiver, a coherent transmitter, a coherent receiver and a coherent transceiver.

The present invention can be summarized as relating to a monolithic InP-based PIC 1 comprising a first photonic assembly 2 that comprises a first optical splitter-combiner unit 3 having a first end part that is optically connected with a first optical waveguide 9 and a second end part that is optically connected with a first main photonic circuit 10 and a first auxiliary photonic circuit 11. The first auxiliary photonic circuit comprises a first laser unit 12, and a first SOA 13. The first SOA 13 is configurable to be in a first operational state in which the first SOA 13 allows optical communication between the first laser unit 12 and the first optical splitter-combiner unit 3, or a second operational state in which the first SOA 13 prevents optical communication between the first laser unit 12 and the first optical splitter-combiner unit 3. The invention also relates to an opto-electronic system 60 comprising said PIC 1.

It will be clear to a person skilled in the art that the scope of the present invention is not limited to the examples discussed in the foregoing but that several amendments and modifications thereof are possible without deviating from the scope of the present invention as defined by the attached claims. In particular, combinations of specific features of various aspects of the invention may be made. An aspect of the invention may be further advantageously enhanced by adding a feature that was described in relation to another aspect of the invention. While the present invention has been illustrated and described in detail in the figures and the description, such illustration and description are to be considered illustrative or exemplary only, and not restrictive.

The present invention is not limited to the disclosed embodiments. Variations to the disclosed embodiments can be understood and effected by a person skilled in the art in practicing the claimed invention, from a study of the figures, the description and the attached claims. In the claims, the word "comprising" does not exclude other steps or elements, and the indefinite article "a" or "an" does not exclude a plurality. The mere fact that certain measures are recited in mutually different dependent claims does not indicate that a combination of these measures cannot be used to advantage. Any reference numerals in the claims should not be construed as limiting the scope of the present invention.

REFERENCE NUMERALS

1 monolithic InP-based PIC
2 first photonic assembly
3 first optical splitter-combiner unit
4 first end part of the first optical splitter-combiner unit
first optical interface
6 second end part of the first optical splitter-combiner unit
7 second optical interface
8 third optical interface
9 first optical waveguide
first main photonic circuit
11 first auxiliary photonic circuit
12 first laser unit
13 first SOA
14 first end facet of the first SOA
second end facet of the first SOA
16 common p-type ohmic contact
17 second SOA
18 third end facet of the second SOA
19 fourth end facet of the second SOA
first optical reflector
21 second optical reflector
22 second optical waveguide
23 third optical waveguide
24 fourth optical waveguide
laser
26 optical output facet of the laser
27 second photonic assembly
28 second optical splitter-combiner unit
29 third end part of the second optical splitter-combiner unit
fourth optical interface
31 fourth end part of the second optical splitter-combiner unit
32 fifth optical interface
33 sixth optical interface
34 fifth optical waveguide
second main photonic circuit
36 second auxiliary photonic circuit
37 second laser unit
38 third SOA
39 fifth end facet of the third SOA
sixth end facet of the third SOA
41 fourth SOA
42 seventh end facet of the fourth SOA
43 eighth end facet of the fourth SOA
44 third optical reflector
fourth optical reflector 46 sixth optical waveguide
47 seventh optical waveguide
48 eighth optical waveguide
49 optical polarization unit
50 optical phase shifter
51 edge of the PIC
60 opto-electronic system
L optical cavity length of the laser

The invention claimed is:

1. A monolithic indium phosphide, InP,-based photonic integrated circuit comprising:
   a first photonic assembly that comprises:
   a first optical splitter-combiner unit having a first end part that is provided with at least a
   first optical interface and a second end part that is provided with at least a second optical interface and a third optical interface;
   a first optical waveguide that is arranged in optical communication with the first optical interface of the first optical splitter-combiner unit;
   a first main photonic circuit that is arranged in optical communication with the second optical interface of the first optical splitter-combiner unit; and
   a first auxiliary photonic circuit that is arranged in optical communication with the third optical interface of the first optical splitter-combiner unit, the first auxiliary photonic circuit comprising:
   a first laser unit; and
   a first semiconductor optical amplifier, SOA, having a first end facet that is arranged in optical communication with the third optical interface of the first optical splitter-combiner unit, and a second end facet that is arranged in optical communication with the first laser unit, the first SOA being configurable to be in:
   a first operational state in which optical communication between the first laser unit and the first optical splitter-combiner unit is allowed; or
   a second operational state in which optical communication between the first laser unit and the first optical splitter-combiner unit is prevented; and
   a second photonic assembly that comprises:
   a second optical splitter-combiner unit having a third end part that is provided with at least
   a fourth optical interface and a fourth end part that is provided with at least a fifth optical interface and a sixth optical interface;
   a fifth optical waveguide that is arranged in optical communication with the fourth optical interface of the second optical splitter-combiner unit;
   a second main photonic circuit that is arranged in optical communication with the fifth optical interface of the second optical splitter-combiner unit; and
   a second auxiliary photonic circuit that is arranged in optical communication with the sixth optical interface of the second optical splitter-combiner unit, the second auxiliary photonic circuit comprising:
   a second laser unit; and
   a third SOA having a fifth end facet that is arranged in optical communication with the sixth optical interface of the second optical splitter-combiner unit, and a sixth end facet that is arranged in optical communication with the second laser unit, the third SOA being configurable to be in:
   a first operational state in which optical communication between the second laser unit and the second optical splitter-combiner unit is allowed; or
   a second operational state in which optical communication between the second laser unit and the second optical splitter-combiner unit is prevented;
   wherein the first photonic assembly and the second photonic assembly are configured to allow optical radiation that is guided by the first optical waveguide of the first photonic assembly and optical radiation that is guided by the fifth optical waveguide of the second photonic assembly to have different optical polarization states.

2. The monolithic InP-based photonic integrated circuit according to claim 1, wherein the first SOA, when being in the first operational state, is configured to amplify optical radiation incident on the second end facet of the first SOA and to emit the amplified optical radiation at the first end facet of the first SOA towards the third optical interface of the first optical splitter-combiner unit, and wherein the first SOA, when being in the second operational state, is configured to absorb optical radiation incident on the first end facet of the first SOA.

3. The monolithic InP-based photonic integrated circuit according to claim 2, wherein the first laser unit and the first SOA are provided with a common p-type ohmic contact.

4. The monolithic InP-based photonic integrated circuit according to claim 1, wherein the first laser unit and the first SOA are provided with a common p-type ohmic contact.

5. The monolithic InP-based photonic integrated circuit according to claim 1, wherein the first main photonic circuit is configured and arranged to be an optical receiver.

6. The monolithic InP-based photonic integrated circuit according to claim 1, wherein the first laser unit comprises:
   a second SOA having a third end facet and a fourth end facet;
   a first optical reflector that is arranged in optical communication with:
   the second end facet of the first SOA; and
   the third end facet of the second SOA; and
   a second optical reflector that is arranged in optical communication with the fourth end facet of the second SOA.

7. The monolithic InP-based photonic integrated circuit according to claim 6, wherein the first auxiliary photonic circuit further comprises:
   a second optical waveguide that is arranged to optically interconnect the third optical interface of the first optical splitter-combiner unit and the first end facet of the first SOA;
   a third optical waveguide that is arranged to optically interconnect the second end facet of the first SOA and the first optical reflector; and
   a fourth optical waveguide that is arranged to optically interconnect the first optical reflector and the third end facet of the second SOA.

8. The monolithic InP-based photonic integrated circuit according to claim 7, wherein at least one of the first SOA and the second SOA is configured and arranged to be driven with a direct current source.

9. The monolithic InP-based photonic integrated circuit according to claim 6, wherein the first SOA and the second SOA are configured and arranged to be driven with a pulsed current source or the second SOA is configured and arranged to be driven with a pulsed current source.

10. The monolithic MP-based photonic integrated circuit according to claim 6, wherein at least one of the first SOA and the second SOA is configured and arranged to be driven with a direct current source.

11. The monolithic InP-based photonic integrated circuit according to claim 6, wherein the first SOA and the second SOA are configured and arranged to be driven with a pulsed current source or the second SOA is configured and arranged to be driven with a pulsed current source.

12. The monolithic InP-based photonic integrated circuit according to claim 1, wherein the first laser unit comprises a laser having an optical output facet that is arranged in optical communication with the second end facet of the first SOA.

13. The monolithic lnP-based photonic integrated circuit according to claim 11, wherein the first auxiliary photonic circuit comprises:
   a second optical waveguide that is arranged to optically interconnect the third optical interface of the first optical splitter-combiner unit and the first end facet of the first SOA;
   a third optical waveguide that is arranged to optically interconnect the second end facet of the first SOA and the optical output facet of the laser.

14. The monolithic InP-based photonic integrated circuit according to claim 12, wherein at least one of the first SOA and the laser is configured and arranged to be driven with a direct current source.

15. The monolithic InP-based photonic integrated circuit according to claim 12, wherein the first SOA and the laser are configured and arranged to be driven with a pulsed current source or the laser is configured and arranged to be driven with a pulsed current source.

16. The monolithic InP-based photonic integrated circuit according to claim 13, wherein the first SOA and the laser are configured and arranged to be driven with a pulsed current source or the laser is configured and arranged to be driven with a pulsed current source.

17. The monolithic InP-based photonic integrated circuit according to claim 11, wherein at least one of the first SOA and the laser is configured and arranged to be driven with a direct current source.

18. The monolithic InP-based photonic integrated circuit according to claim 1, wherein at least one of the first photonic assembly and the second photonic assembly is provided with at least one of an optical polarization unit and an optical phase shifter.

19. An opto-electronic system comprising a monolithic lnP-based photonic integrated circuit according to claim 1, wherein the opto-electronic system is one of a transmitter, a receiver, a transceiver, a coherent transmitter, a coherent receiver and a coherent transceiver.

* * * * *

UNITED STATES PATENT AND TRADEMARK OFFICE
CERTIFICATE OF CORRECTION

PATENT NO. : 11,874,495 B2
APPLICATION NO. : 17/672847
DATED : January 16, 2024
INVENTOR(S) : Koene et al.

It is certified that error appears in the above-identified patent and that said Letters Patent is hereby corrected as shown below:

In the Claims

In Claim 4, Line 1, replace "lnP-based" with --InP-based--.

In Claim 6, Line 1, replace "lnP-based" with --InP-based--.

In Claim 8, Line 1, replace "lnP-based" with --InP-based--.

In Claim 10, Line 1, replace "MP-based" with --InP-based--.

In Claim 11, Line 1, replace the dependency "6" with --7--.

In Claim 13, Line 1, replace "lnP-based" with --InP-based-- and in Line 2, replace the dependency "11" with --12--.

In Claim 17, Line 1, replace the dependency "11" with --13--.

In Claim 19, Line 1, replace "lnP-based" with --InP-based--.

Signed and Sealed this
Fifth Day of March, 2024

Katherine Kelly Vidal
*Director of the United States Patent and Trademark Office*